United States Patent [19]

Han

[11] Patent Number: 5,673,713
[45] Date of Patent: Oct. 7, 1997

[54] APPARATUS FOR CLEANSING SEMICONDUCTOR WAFER

[75] Inventor: Suk-Bin Han, Choongchungbook-Do, Rep. of Korea

[73] Assignee: LG Semicon Co., Ltd., Choongcheongbuk-do, Rep. of Korea

[21] Appl. No.: 769,059

[22] Filed: Dec. 18, 1996

[30] Foreign Application Priority Data

Dec. 19, 1995 [KR] Rep. of Korea ............... 51994/1995
Dec. 19, 1995 [KR] Rep. of Korea ............... 51995/1995

[51] Int. Cl.⁶ .............................................. B08B 3/04
[52] U.S. Cl. ............... 134/56 R; 134/105; 134/155; 134/186; 134/201; 134/902
[58] Field of Search ............... 134/902, 201, 134/56 R, 155, 186, 111, 105, 200

[56] References Cited

U.S. PATENT DOCUMENTS

| | | | |
|---|---|---|---|
| 4,777,970 | 10/1988 | Kusuhara | 134/902 |
| 5,485,861 | 1/1996 | Hiratsuka et al. | 134/902 |

FOREIGN PATENT DOCUMENTS

| | | | |
|---|---|---|---|
| 62-279640 | 12/1987 | Japan | 134/902 |
| 4-99025 | 3/1992 | Japan | 134/902 |
| 4-822219 | 3/1992 | Japan | 134/902 |

*Primary Examiner*—Frankie L. Stinson
*Attorney, Agent, or Firm*—Morgan, Lewis and Bockius, LLP

[57] ABSTRACT

An improved apparatus for cleansing a semiconductor wafer which is capable of reducing the cleansing space by providing an inner tub made of a shape memory alloy and deforming the shape of the inner tub into the shape of the wafer, for thus reducing the cleansing space. The apparatus includes an outer tub having a supply tube for supplying a cleansing liquid and a discharge tube for discharging the cleansing liquid, an inner tub including an upper portion made of a shape memory alloy and disposed within the outer tub, a temperature control member for controlling the temperature of the cleansing liquid, a baffle plate for controlling the flowing amount of the cleansing liquid supplied to a wafer through the supply tube, a pump disposed in the supply tube for supplying the cleansing liquid into the inner tub, and a filter for filtering the cleansing liquid.

13 Claims, 6 Drawing Sheets

5,673,713

APPARATUS FOR CLEANSING SEMICONDUCTOR WAFER

BACKGROUND OF THE INVENTION

1. Field of the Invention

The present invention relates to an apparatus for cleansing a semiconductor wafer, and in particular to an improved apparatus for cleansing a semiconductor wafer which is capable deforming the shape of an inner tub into the shape of a wafer during a cleansing process, for thus reducing the cleansing space, and the consumption amount of the cleansing liquid, and maximizing the cleansing effect.

2. Description of the Conventional Art

As a high integration semiconductor device is made, fine particles on the surface of the wafer may cause a critical damage to the characteristic of the device.

Therefore, recently, the cleansing technique is considered to be the most important technique in the industry so as to effectively cleanse the fine particles on the surface of the wafer.

In the LSI technique, a semiconductor device of 2 μm is actually used in the industry. When fabricating such semiconductor devices, a cleansing technique for maintaining an ultra-environment is necessary in the fabrication process of the high integration semiconductor device.

Therefore, as the wafer is made larger, and the chip size is made smaller, a new cleansing apparatus has been developed. In particular, a technique for reducing the cleansing liquid (or a cleansing water) provided into the cleansing tub has been intensively studied.

FIG. 1 is a view illustrating the construction of a conventional semiconductor wafer cleansing apparatus, which is an over flow bath system.

As shown therein, there are provided an outer tub 1 having a cleansing liquid supply tube 1a and a discharge tube 1b arranged below the outer tub 1, an inner tub 2 arranged within the outer tub 2, a baffle plate 3 for supplying the cleansing liquid to a wafer "W" mounted on the bottom of the inner tub 2, and a pump 4 disposed in the supply tube 1a for supplying the cleansing liquid.

The operation of cleansing the wafer in the conventional semiconductor cleansing apparatus will now be explained with reference to the accompanying drawings.

First, the wafer "W" to be cleansed is mounted in the inner tub 2, and then the pump 4 is driven, and the cleansing liquid is supplied to the interior of the inner tub 2 through the supply tube 1a disposed below the outer tub 1, for thus cleansing the fine particles on the surface of the wafer "TW".

Here, the amount and the flowing rate of the cleansing liquid supplied to the inner tub 2 are controlled by a plurality of distribution holes (not shown) formed in the baffle plate 3, for thus cleansing the wafer "W". When the cleansing liquid is filled in the inner tub 2, the cleansing liquid is over-flown to the outer tub 1, and the thusly over-flown cleansing liquid is supplied to the inner tub 2 by the motor 4. If the cleansing liquid is polluted, the polluted cleansing liquid is discharged to the outside through a predetermined path.

However, the conventional semiconductor wafer cleansing apparatus is directed to an over flow bath system which is intended for supplying to the inner tub 2 and over-flowing the cleansing liquid, so that the cleansing liquid must be supplied to the limit of the inner tub 2 beyond the top of the wafer "W". Therefore, it is impossible to reduce the amount of the cleansing liquid. In addition, it is impossible to control the flowing manner of the cleansing liquid with respect to various shapes of the wafer "W", for thus decreasing the cleansing effect of the wafer "W".

SUMMARY OF THE INVENTION

Accordingly, it is an object of the present invention to provide an apparatus for cleansing a semiconductor wafer which overcomes the problems encountered in the conventional art.

It is another object of the present invention to provide an improved apparatus for cleansing a semiconductor wafer which is capable of reducing the cleansing space by providing an inner tub made of a shape memory alloy and deforming the shape of the inner tub into the shape of the wafer, for thus reducing the cleansing space.

To achieve the above objects, in accordance with the first embodiment of the present invention, there is provided an apparatus for cleansing a semiconductor wafer which includes an outer tub having a supply tube for supplying a cleansing liquid and a discharge tube for discharging the cleansing liquid, an inner tub including an upper portion made of a shape memory alloy and disposed within the outer tub, a temperature control member for controlling the temperature of the cleansing liquid, a baffle plate for controlling the flowing amount of the cleansing liquid supplied to a wafer through the supply tube, a pump disposed in the supply tube for supplying the cleansing liquid into the inner tub, and a filter for filtering the cleansing liquid.

To achieve the above objects, in accordance with the second embodiment of the present invention, there is provided an apparatus for cleansing a semiconductor wafer which includes an outer tub having a supply tube for supplying a cleansing liquid and a discharge tube for discharging the cleansing liquid, an inner tub including an upper portion made of a shape memory alloy and disposed within the outer tub, a baffle plate for controlling the flowing amount of the cleansing liquid supplied to a wafer through a supply tube, a pump disposed in the supply tube for supplying the cleansing liquid into the inner tub, a filter for filtering the cleansing liquid, a driving member for deforming the upper portion of the inner tub, and a control member for controlling the driving of the driving member.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
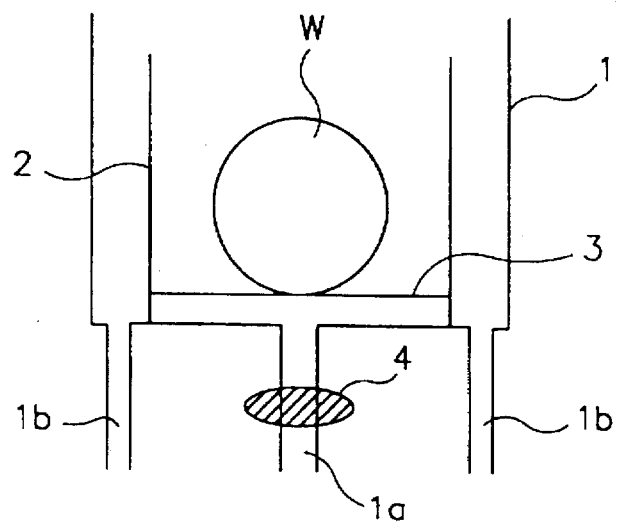
FIG. 1 is a view illustrating the construction of a conventional semiconductor wafer cleansing apparatus.
Figure 2:
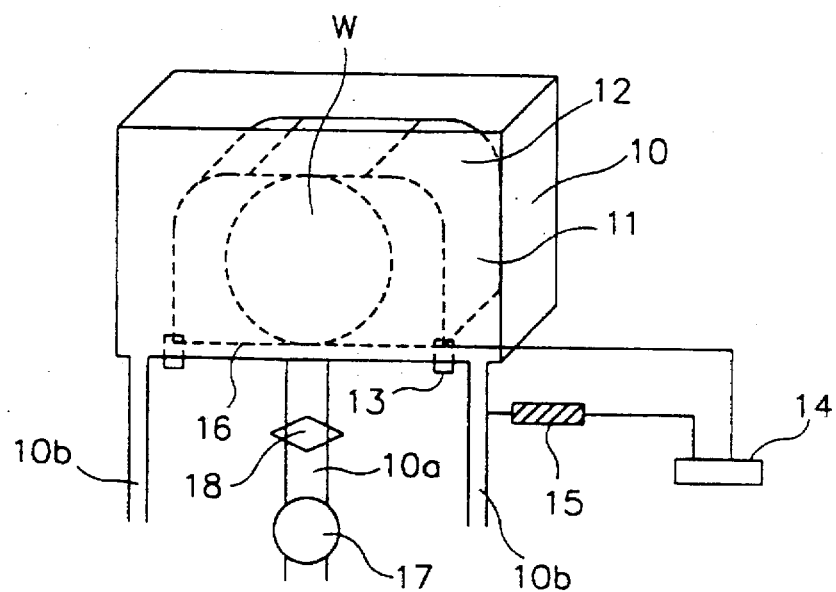
FIG. 2 is a perspective view illustrating the construction of a semiconductor wafer cleansing apparatus according to a first embodiment of the present invention.

FIG. 2 is a perspective view illustrating the construction of a semiconductor wafer cleansing apparatus according to a first embodiment of the present invention.

As shown therein, an outer tub 10 includes a supply tube 10a for supplying a cleansing liquid therethrough and a discharge tube 10b for discharging the cleansing liquid therethrough both ends of which are connected to the outer tub 10. An inner tub 11 is disposed within the outer tub. An upper portion 12 of the inner tub 11 is formed of a shape memory alloy which is changed to the shape of the wafer "W" at a predetermined temperature. In addition, the inner tub 11 is coated with a material which does not form fine particles and has a good characteristic against a cleansing chemical reaction and the temperature of the cleansing liquid.

In addition, a temperature controller 13 is disposed below the inner tub 11 for controlling the temperature of the cleansing liquid. A control member 14 is connected to the temperature controller 13 for automatically controlling the temperature of the temperature controller 13. A temperature sensor 15 is disposed in the discharge tube 10b for measuring the temperature of the cleansing liquid discharged from the discharge tube 10b and is connected to the control member 14.

Here, in the above descriptions, the temperature controller 13 is disposed below the inner tub 11 but is preferably disposed in the supply tube 10a connected for supplying the cleansing liquid therethrough. The installation position thereof is not limited thereto. The temperature controller 13 may be disposed anywhere in which it is possible to effectively control the temperature of the cleansing liquid.

In addition, a baffle plate 16 having a plurality of distribution holes (not shown) is disposed in the inner tub 11 for uniformly distributing the cleansing liquid, which in introduced through the supply tube 10a, to the wafer "W". A pump 17 is disposed in the supply tube 10a for pumping the cleansing liquid, and a filter 18 is disposed in the supply tube 10a for filtering the cleansing liquid.

The operation of the semiconductor wafer cleansing apparatus according to a first embodiment of the present invention will now be explained with reference to FIG. 2.

Figure 3A:
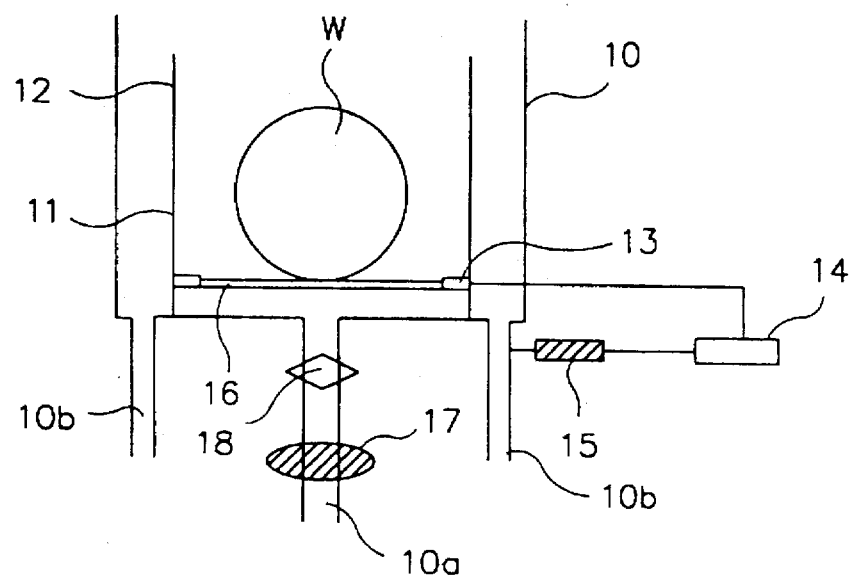
FIGS. 3A and 3B are respectively a cross-sectional view and a top view illustrating a state that a wafer is provided in a semiconductor wafer cleansing apparatus.
Figure 3B:
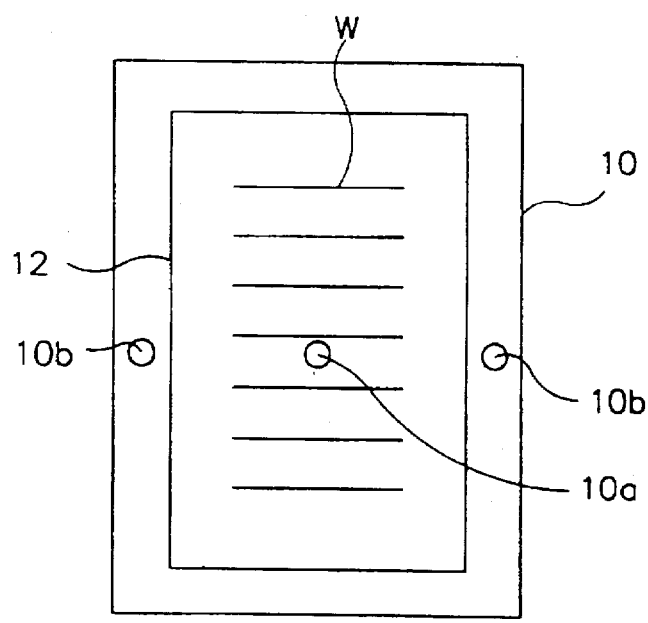

FIGS. 3A and 3B are respectively a cross-sectional view and a top view illustrating a state that a wafer is provided in a semiconductor wafer cleansing apparatus.

As shown therein, in a state that the upper portion 12 of the inner tub 11 is made vertical, the wafer "W" to be cleansed is moved into the inner tub 11 by using a wafer chuck (not shown).

Thereafter, the cleansing liquid is filtered by the filter 18 and is supplied to the interior of the inner tub 11 by the pump 17 disposed in the supply tube 10a. The control member 14 controls the temperature controller 13 disposed in the inner tub 11 and increases the temperature of the temperature up to a predetermined temperature of about 40° C.~50° C.

Figure 4A:
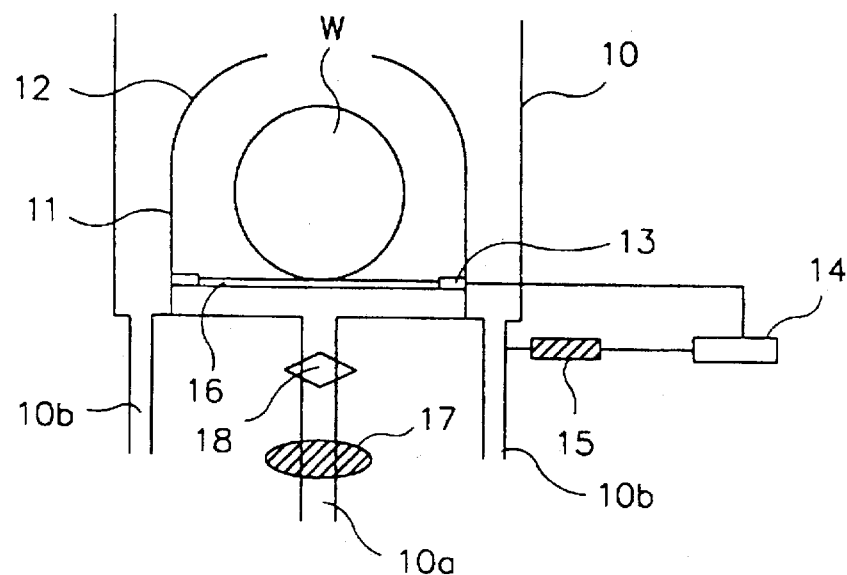
FIGS. 4A and 4B are respectively a cross-sectional view and a top view for explaining a cleansing process of FIG. 2.
Figure 4B:
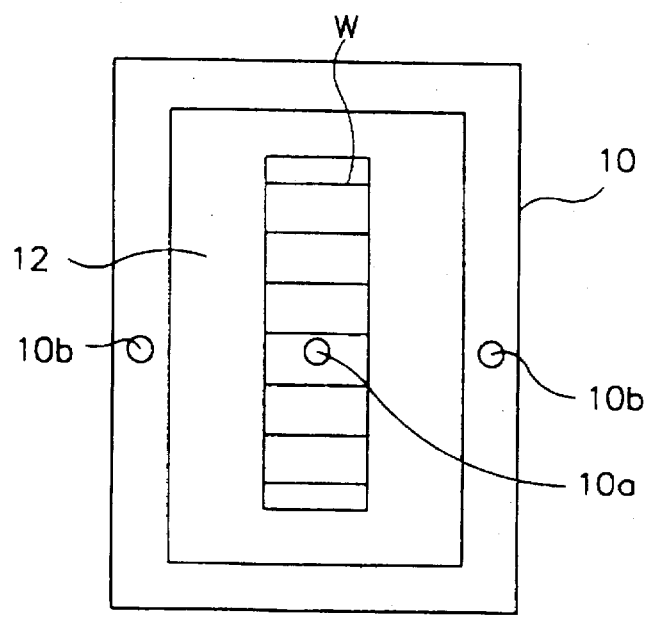

When the temperature is increased up to such a temperature, the upper portion 12 of the inner tub 11, which is made of a shape memory alloy, as shown in FIGS. 4A and 4B, is inwardly bent and is deformed into the shape of the wafer "W". Here, the distance between the inner wall of the upper portion 12 of the inner tub 11 and the outer circumferential surface of the wafer "W" is more than 1 mm.

In a state that the upper portion 12 of the inner tub 11 was deformed, and the cleansing space become smaller, when the cleansing liquid is supplied, the cleansing liquid is flown along the wafer "W" in the inner tub 11, and the cleansing liquid is gathered at an upper edge portion of the wafer "W". Thereafter, when the cleansing liquid is continuously supplied thereto, the cleansing liquid is over-flown beyond the upper edge of the inner tub 11 and is discharged through the discharge tube 10b disposed in the lower portion of the outer tub 10. The thusly discharged cleansing liquid is circulated in the system by the pump 17, and a part thereof is discharged to the outside of the system as waste.

In addition, the temperature of the cleansing liquid is detected by the temperature sensor 15 disposed in the discharge tube 10b during the cleansing process. The thusly detected temperature data is transmitted to the control member 14. The control member 14 controls the temperature of the temperature controller 13 based on the temperature data. Namely, when the temperature of the cleansing liquid detected by the temperature sensor 15 is constant, the control member 14 judges the process as being performed, and controls the temperature to be maintained. When the process is completed, the control member 14 controls the temperature of the temperature controller 13 to be room temperature.

When the cleansing process is finished, and the temperature of the cleansing liquid is lowered to the room temperature, the upper portion 12 of the inner tub 11, which is made of a shape memory alloy, is made vertical. Thereafter, the wafer "W" is removed to the outside of the cleansing tub by using the wafer chuck, and the following processes are performed.

Figure 5:
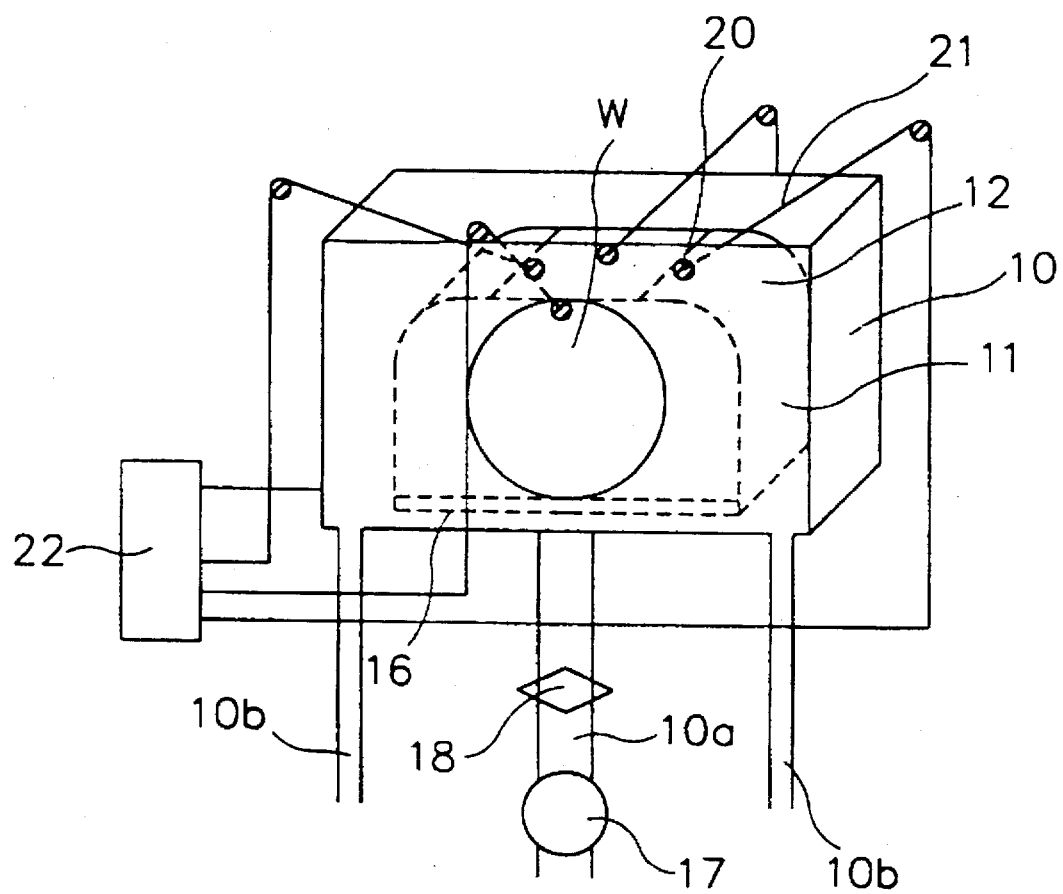
FIG. 5 is a perspective view illustrating the construction of a semiconductor wafer cleansing apparatus according to a second embodiment of the present invention.

FIG. 5 is a perspective view illustrating the construction of a semiconductor wafer cleansing apparatus according to a second embodiment of the present invention.

As shown therein, identically with the first embodiment of the present invention, there are provided an outer tub 10 including a supply tube 10a and a discharge tube 10b, an inner tub 11 having an upper portion 12, a baffle plate 16, a pump 17, and a filter 18.

In addition, four robot arms 21 are disposed at the upper portion of each wall of the inner tub 11 in cooperation with a hinge member 20. A control member 22 is disposed in each robot arm 21 for controlling the robot arm 21. Here, the hinge member 20 is a hinge or the like for hingedly tilting the upper portion 12 by using the robot arms 21. The upper portion of the inner tub 11 is made of a shape memory alloy which can be deformed at a predetermined temperature, and is flexible. In addition, the control member 22 is the same as the control member 14 as shown in FIG. 2.

The operation of the semiconductor wafer cleansing apparatus according to a second embodiment of the present invention will now be explained with reference to the accompanying drawings.

Figure 6A:
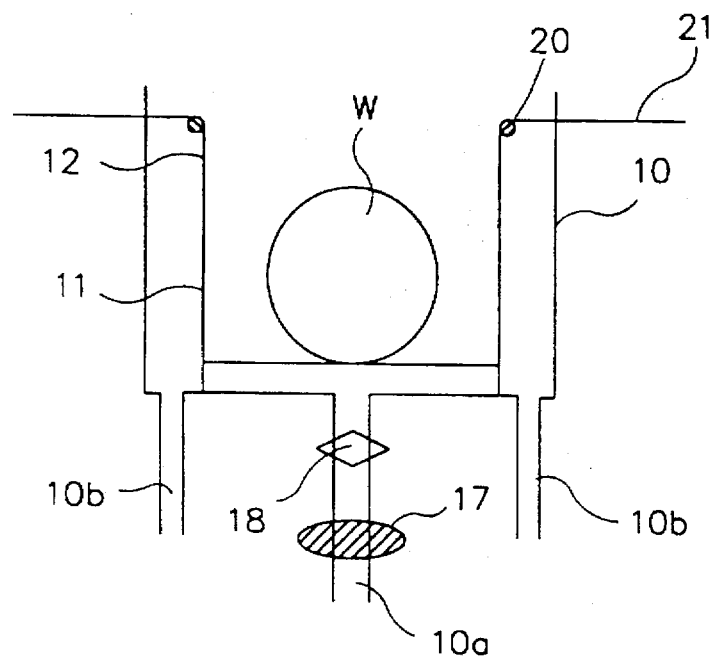
FIGS. 6A and 6B are respectively a cross-sectional view and a top view illustrating a state that a wafer is provided in a semiconductor wafer cleansing apparatus.
Figure 6B:
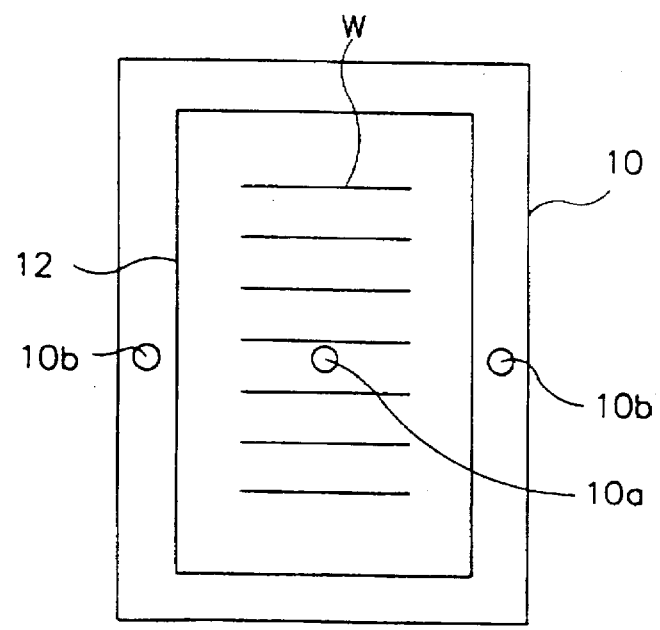
Figure 7A:
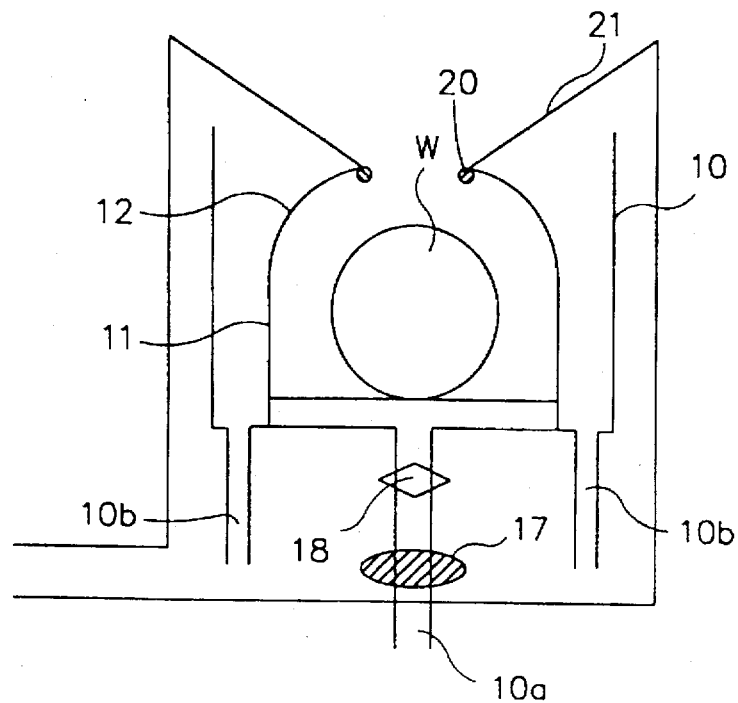
FIGS. 7A and 7B are respectively a cross-sectional view and a top view for explaining a cleansing process of FIG. 5.
Figure 7B:
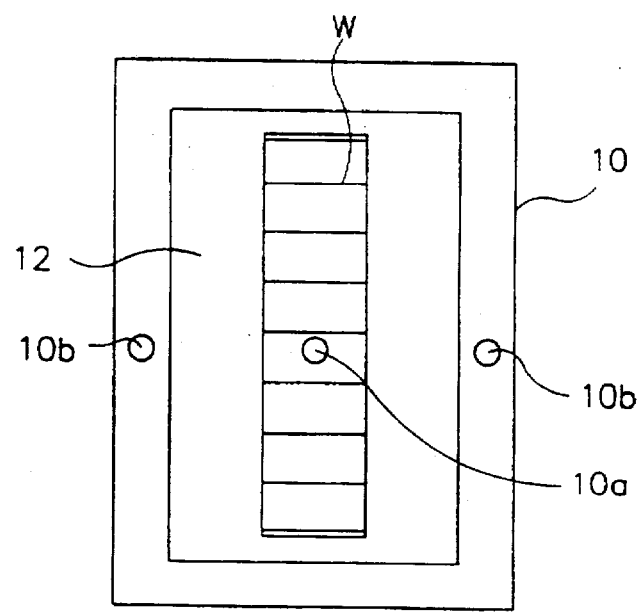

FIGS. 6A and 6B are respectively a cross-sectional view and a top view illustrating a state that a wafer is provided in a semiconductor wafer cleansing apparatus.

As shown therein, in a state that the upper portion 12 o the inner tub is vertical in cooperation with the robot arm 21, a wafer "W" to be cleansed is moved into the inner tub 11 by using a wafer chuck (not shown).

Thereafter, when the cleansing liquid of about 40° C.~50° C. is supplied into the inner tub 11 through the supply liquid by the pump 17, since the upper portion 12 of the inner tub 11 is made of a shape memory alloy, which is originally made to be deformed into the shape of the wafer "W" at about 40° C.~50° C., the upper portion 12 of the inner tub 11 is inwardly bent as the shape of the wafer "W". Here, the robot arm 21 is not supplied with a physical force, and the upper portion 12 of the inner tub 11 and the outer circumferential surface of the wafer "W" is spaced apart by more than 1 mm.

In a state that the upper portion 12 of the inner tub 11 is inwardly bent, for thus obtaining a smaller cleansing space therein, the cleansing liquid is continuously supplied into the inner tub 11, for thus cleansing the wafer "W". After the cleansing process is finished, the robot arm 21 is backwardly moved in accordance with the control by the control member 22, and the upper portion 12 of the inner tub 11 is made vertical. Thereafter, the wafer "W" is removed from the cleansing tub by using the wafer chuck (not shown), and the next process is performed.

In the second embodiment of the present invention as shown in FIG. 5, the upper portion 12 of the inner tub 11, which is made of a shape memory alloy, is made vertical by using the robot arm 21 after the cleansing process is finished. The above-described technique is not limited thereto. Namely, various processes may be possible for the same purpose. For example, an elastic member such as a spring may be connected between the upper portion 12 of the inner tub 11 and the wall of the outer wall 10 based on the difference between the deforming force of the shape memory alloy and the elastic force of the elastic member. Namely, during the cleansing processes, namely, at the temperature of the cleansing liquid, the deformation force of the shape memory alloy is higher than the elastic force, for thus inwardly bending the shape memory alloy, and when the cleansing processes are finished, namely, when the cleansing liquid supply is stopped, since the deformation force of the shape memory alloy is removed, the upper portion 12 of the inner tub 11 is made vertical by the overcoming force of the elastic member.

As described above, the apparatus for cleansing a semiconductor wafer according to the present invention is basically directed to reducing the cleansing space by deforming the shape of the inner tub into the shape of the wafer during the cleansing processes, for thus reducing the consumption amount of the cleansing liquid, and is directed to maximizing the cleansing effect with respect to the edge portion of the wafer by flowing the cleansing liquid along the outer circumferential surface of the wafer and focussing the flowing thereof to the edge portion of the wafer, for thus reducing the cleansing time.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. An apparatus for cleansing a semiconductor wafer, comprising:

an outer tub having a supply tube for supplying a cleansing liquid and a discharge tube for discharging the cleansing liquid;

an inner tub including an upper portion made of a shape memory alloy and disposed within the outer tub;

a temperature control means for controlling the temperature of the cleansing liquid;

a baffle plate for controlling the flowing amount of the cleansing liquid supplied to a wafer through the supply tube;

a pump disposed in the supply tube for supplying the cleansing liquid into the inner tub; and a filter for filtering the cleansing liquid.

2. The apparatus of claim 1, wherein said temperature control means includes:

a temperature controller for controlling temperature;

a control means for controlling the temperature controller; and a temperature sensor for measuring the temperature of the cleansing liquid.

3. The apparatus of claim 1, wherein the entire portion of the inner tub is made of a shape memory material.

4. The apparatus of claim 1, wherein said upper portion of the inner tub is deformed into the shape of the wafer, and the distance between the upper inner wall of the inner tub and the outer circumferential surface of the wafer is more than 1 mm.

5. The apparatus of claim 1, wherein the inner wall of the inner tub is coated with a material which does not form fine particles during deformation and has a good characteristic with respect to the cleansing chemicals and cleansing temperature.

6. The apparatus of claim 1, further comprising a driving means for deforming the upper portion of the inner tub, and a control means for controlling the driving means.

7. The apparatus of claim 6, wherein said upper portion of the inner tub is made of a shape memory alloy which can be deformed by a physical force.

8. An apparatus for cleansing a semiconductor wafer, comprising:

an outer tub having a supply tube for supplying a cleansing liquid and a discharge tube for discharging the cleansing liquid;

an inner tub including an upper portion made of a shape memory alloy and disposed within the outer tub;

a baffle plate for controlling the flowing amount of the cleansing liquid supplied to a wafer through a supply tube;

a pump disposed in the supply tube for supplying the cleansing liquid into the inner tub;

a filter for filtering the cleansing liquid;

a driving means for deforming the upper portion of the inner tub; and a control means for controlling the driving of the driving means.

9. The apparatus of claim 8, wherein said upper portion of the inner tub is deformed into the shape of the wafer during a cleansing process, and the distance between the upper inner wall of the inner tub and the outer circumferential surface of the wafer is more than 1 mm.

10. The apparatus of claim 8, wherein said upper portion of the inner tub is made of a shape memory alloy which can be deformed by a physical force.

11. The apparatus of claim 8, wherein said driving means is a robot arm.

12. The apparatus of claim 8, wherein said driving means is an elastic member.

13. The apparatus of claim 8, wherein the inner wall of the inner tub is coated with a material which does not form fine particles during deformation and has a good characteristic with respect to the cleansing chemicals and cleansing temperature.

* * * * *